United States Patent [19]

Kasahara

[11] Patent Number: 5,667,535

[45] Date of Patent: Sep. 16, 1997

[54] WAFER DRYING APPARATUS WITH BALANCING MECHANISM FOR TURNTABLE THEREIN

[75] Inventor: Masayoshi Kasahara, Yamagata, Japan

[73] Assignee: NEC Corporation, Japan

[21] Appl. No.: 569,723

[22] Filed: Dec. 8, 1995

[30] Foreign Application Priority Data

Dec. 26, 1994 [JP] Japan ................................ 6-322663

[51] Int. Cl.⁶ ................................................ H01L 21/304
[52] U.S. Cl. .............................. 29/25.01; 134/902; 34/58; 34/317
[58] Field of Search ....................... 29/25.01; 134/902, 134/58, 317

[56] References Cited

U.S. PATENT DOCUMENTS

| 4,777,732 | 10/1988 | Hirano ........................ 34/8 |
| 4,987,687 | 1/1991 | Sugimoto ................... 34/58 |
| 5,386,645 | 2/1995 | Park et al. ................. 34/317 |

FOREIGN PATENT DOCUMENTS 60-154624  8/1985  Japan .

Primary Examiner—David E. Graybill
Attorney, Agent, or Firm—Hayes, Soloway, Hennessey, Grossman & Hage, P.C.

[57] ABSTRACT

The wafer drying apparatus disclosed includes a plurality of cradles, a turntable, a drying chamber, a balancing mechanism, a shielding plate, and an isolating chamber. The shielding plate is formed of half circular plates which are provided respectively to the supporting member, are partially overlapped near the axis of horizontal rotation, and are configured such that the balancing mechanism is covered thereby and that a peripheral portion thereof extends to a side wall of the drying chamber and is provided with a plurality of vanes. The isolating chamber is partitioned by the shielding plate and has a partition plate defining a vacant section surrounding the balancing mechanism and an exhaust opening from which the air in the drying chamber is drawn out by a pumping action of the vanes due to the rotation of the shielding plate and is exhausted to the outside through an external wall of the partition wall. In this way the balancing mechanism which is a moving member is not exposed to the drying chamber and the contaminants from the balancing mechanism are prevented from entering into the drying chamber.

3 Claims, 2 Drawing Sheets

WAFER DRYING APPARATUS WITH BALANCING MECHANISM FOR TURNTABLE THEREIN

BACKGROUND OF THE INVENTION

1. Field of the Invention

The present invention relates to a wafer drying apparatus in which a holding case accommodating a plurality of semiconductor substrate wafers is rotated on a turntable and the wafers are dried with water being scattered therefrom by centrifugal force, and more particularly to a balancing mechanism for the turntable used in the wafer drying apparatus.

2. Description of the Related Art

A conventional wafer drying apparatus of the kind to which the present invention relates is first explained to assist the understanding of the invention. FIGS. 1A and 1B diagrammatically show an example of the conventional apparatus, FIG. 1A being a sectional view thereof and FIG. 1B being a partially broken perspective view thereof. As shown therein, the apparatus includes a plurality of cradles 2 in each of which the holding case 6 accommodating a plurality of wafers 16 is placed and each of which is allowed to swing vertically and is mounted in the turntable 8 through a supporting member 9 facing to each other with a rotary axis 10 being in the center; a drying chamber 5 which surrounds these cradles 2 and has an exhaust opening 7 at a lower part thereof and a cover 4 to close an upper part; and a balancing mechanism 3 which, in order to adjust the balancing of the rotation of the turntable 8, moves and adjusts the supporting member 9 of the cradles 2 in the radial direction of the rotation of the turntable.

In the operation of drying the wafers 16 using the above wafer drying apparatus, first the holding cases 6 each accommodating the wafers 16 are placed in the empty cradles 2 while the turntable 8 is in a stopped state (FIG. 1B). When the turntable 8 is caused to rotate at a high speed by the rotary axis 10, the cradles 2 rotate 90° about a supporting axis by the centrifugal force and change their positions as shown in FIG. 1A. The water adhered on the wafers 16 scatters by the centrifugal force and is exhausted from the exhaust opening 7 at the lower part of the drying chamber 5.

In the conventional wafer drying apparatus as explained above, there is provided a balancing mechanism 3 in order to attain the rotating balancing of the turntable 8 in the case where the number of wafers placed in one holding case 6 is different from that in the other holding case 6 opposing thereto.

The balancing mechanism 3 includes an eccentric cam 3a carried by the rotary axis of the supporting portion which projects from the surface of the turntable 8, a cam driving axis 3b engaged in a slit provided in the eccentric cam 3a. When the eccentric cam 3a is caused to rotate by the upward/downward movement of the cam driving axis 3b, the sliding portions touching the eccentric cam 3a at the right and the left are caused to slide to the right and the left by pressing force due to the eccentric cam 3a. Consequently, the supporting member 9 mounted on the sliding portions move in the radial direction of the rotation of the turntable whereby the rotating balance of the turntable 8 is achieved.

In the conventional wafer drying apparatus explained above, there was a problem that, while the turntable is being rotated at a high speed, the eccentric cam in the balancing mechanism touches with and slides on the sliding portion so that contaminants are generated from the sliding portion. Further, since the balancing mechanism that generates the contaminants is located in the same holding case that accommodates wafers, a problem is that, during the rotation of the turntable, the contaminants scatter within the entire drying chamber and adhere on the wafers, resulting in the contamination of the wafers and the deterioration of production yields.

An example of the conventional wafer drying apparatus in which a means is provided to prevent the generation of contaminants is disclosed in Japanese Patent Application Kokai Publication No. Sho 60-154624. The disclosed device is one which does not include a balancing mechanism but is arranged such that two wafer holding cases are disposed evenly at the inner periphery of the rotor, and the water on the wafers is expelled by the rotation of the rotor at a high speed. The arrangement includes a rotor driving chamber which surrounds the rotor driving section for the rotation of the rotor and which is separated from the drying chamber. The air in the vacant section of the rotor driving chamber is exhausted from the exhaust opening thereof, and it is so arranged that the rotating driving chamber is in a vacuum state with respect to the drying chamber thus preventing the entry of the contaminants into the drying chamber.

However, in the above wafer drying apparatus, since the rotor driving chamber is in a vacuum state with respect to the drying chamber, the cleaning water in which particles are mixed flows not only into the water exhaust section but also into the portion where the rotary axis is inserted, thereby causing the corrosion of the rotor mechanism or the plugging, by the particles, of the portion where the rotary axis is inserted. This makes the apparatus unendurable to a long time operation. Also, for creating a negative pressure in the rotor driving chamber, it requires an air exhaust means connected to the water exhaust section, and this adds to the cost of the manufacturing equipment.

SUMMARY OF THE INVENTION

An object of the invention, therefore, is to overcome the problems existing in the prior art, and to provide a wafer drying apparatus which is capable of preventing the entry of contaminants from a balancing mechanism into a drying chamber or the entry of water or particles into moving parts thereby ensuring a long period operation of the apparatus.

According to one aspect of the invention, there is provided a wafer drying apparatus comprising:

a plurality of cradles each of which has a holding case for accommodating a plurality of wafers and which are allowed to swing vertically on a supporting member and which are disposed facing each other with the axis of horizontal rotation being positioned in the center;

a turntable over which the cradles are mounted through the supporting member and which rotates horizontally;

a drying chamber which surrounds the cradles;

a balancing mechanism which, for balancing the rotation of the turntable, adjusts the supporting member supporting the cradles by allowing the supporting member to move in a radial direction of the rotation of the turntable;

a shielding plate formed of half circular plates which are provided respectively to the supporting member, are partially overlapped near the axis of horizontal rotation, and are configured such that the balancing mechanism is covered thereby and that a peripheral portion thereof extends to a side wall of the drying chamber and is provided with a plurality of vanes; and an isolating chamber which is partitioned by the shielding plate and has a partition plate which defines a vacant section surrounding the balancing mechanism and an exhaust opening from which the air in the drying chamber is drawn out by a pumping action of the vanes due to the rotation of the shielding plate and is exhausted to the outside through an external wall of the partition plate.

In the wafer drying apparatus according to the invention, the balancing mechanism which is a moving member is not exposed to the drying chamber, and the shielding plate has a pumping function to draw out the air from the drying chamber, and the partition plate prevents the drawn air containing water and particles from entering into the balancing mechanism.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENT OF THE INVENTION

Now, a preferred embodiment of the invention is explained with reference to the drawings.

Figure 1A:
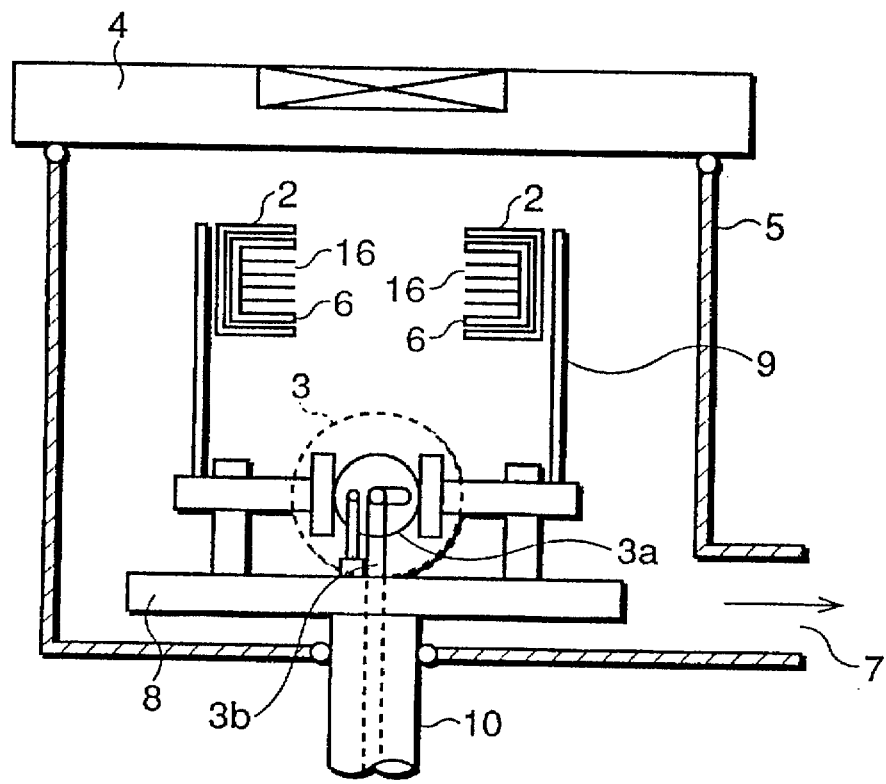
FIGS. 1A and 1B are diagrams showing a conventional wafer drying apparatus, FIG. 1A being a diagrammatic sectional view thereof and FIG. 1B being a partially broken perspective view thereof.
Figure 1B:
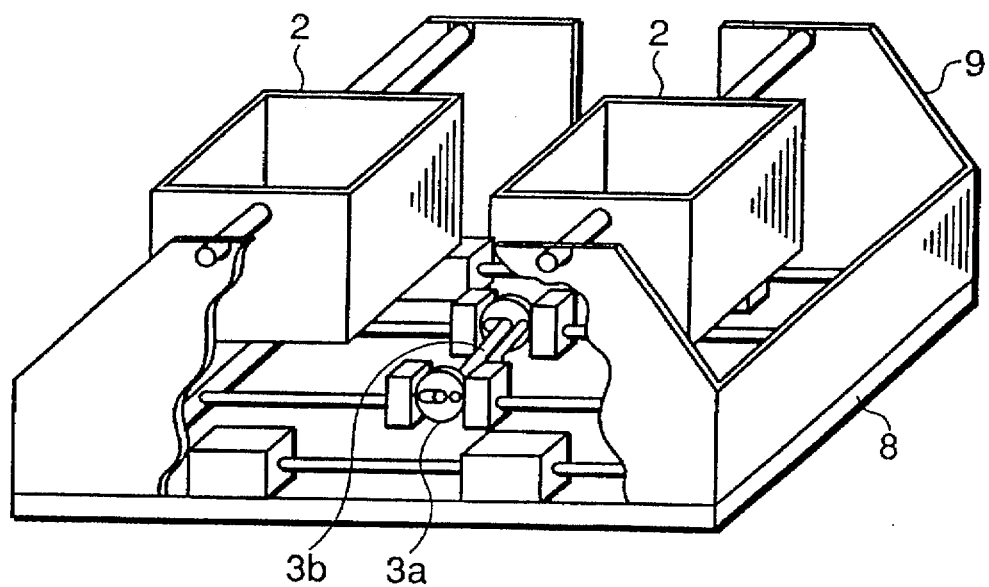
Figure 2A:
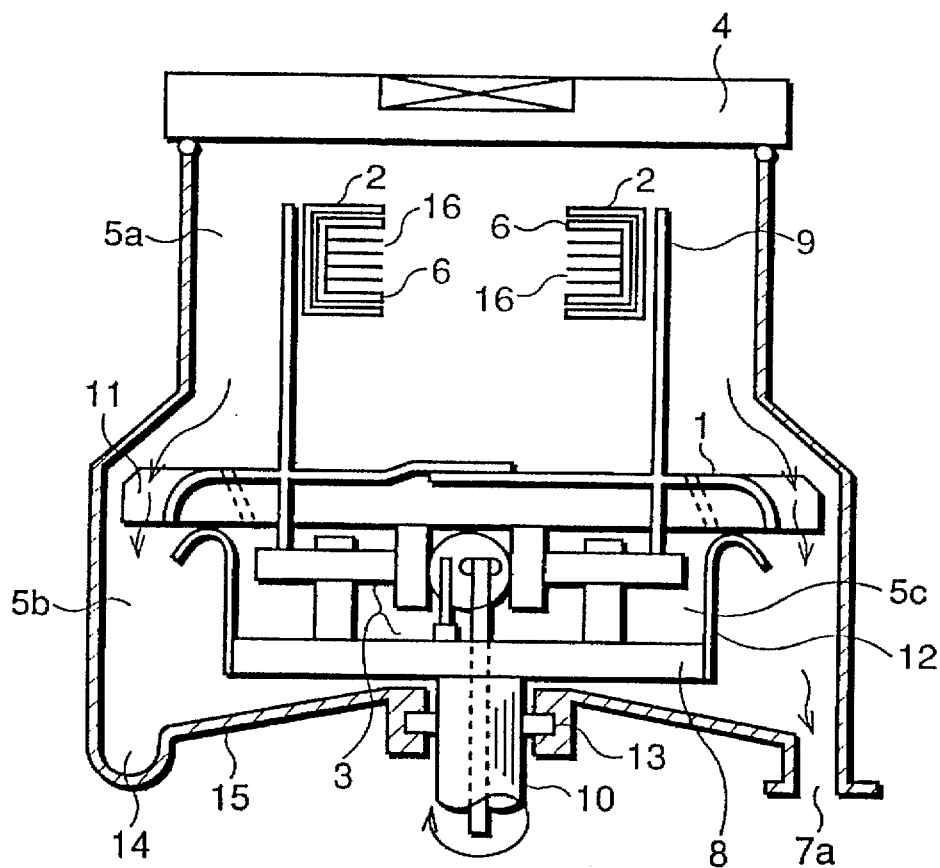
FIGS. 2A and 2B are diagrams showing a wafer drying apparatus according to the invention, FIG. 2A being a diagrammatic section view thereof and FIG. 2B being a partial plan view of a shielding plate used in the apparatus shown in FIG. 2A.
Figure 2B:
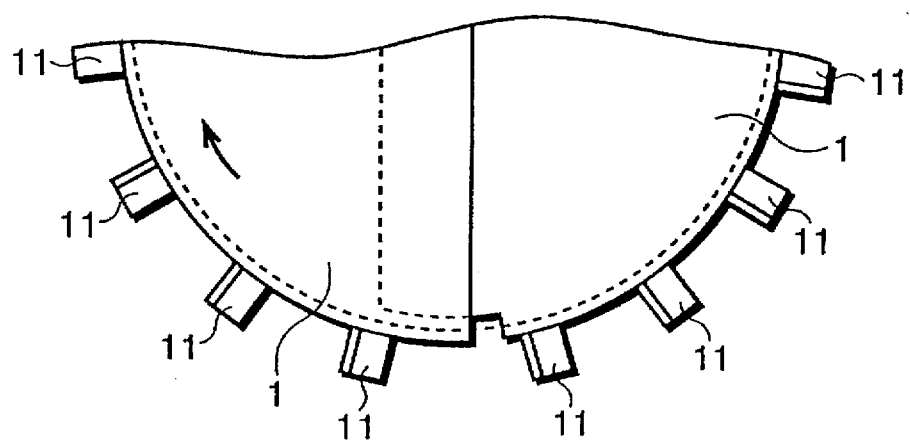

FIGS. 2A and 2B diagrammatically show a wafer drying apparatus according to the invention, FIG. 2A showing it in a sectional view thereof and FIG. 3B showing it in a partial plan view of a shielding plate used in the apparatus shown in FIG. 2A. This wafer drying apparatus is, as shown in FIG. 2A, includes a shielding plate 1 and an isolating chamber 5b. The shielding plate 1 in a disk form is configured such that divided portions of the shielding plate 1 are attached respectively to the supporting member 9 in a manner to be overlapped with each other at a vicinity of a rotary axis 10 and to cover a balancing mechanism 3, and that a peripheral portion of the shielding plate 1 extends to a side wall of the drying chamber 5a and a plurality of vanes 11 are provided at the peripheral portion of the shielding plate 1. The isolating chamber 5b has a partition plate 12 which forms a vacant section 5c surrounding the balancing mechanism, and an exhaust opening 7a through which the air in the drying chamber 5a is drawn and exhausted to the outside through an external wall of the shielding plate by the pump action of the vanes 11 due to the rotation of the shielding plate 1.

As in the conventional example, the wafer drying apparatus according to the invention includes a plurality of cradles 2 in each of which the holding case 6 accommodating a plurality of wafers 16 is placed and each of which is allowed to swing in the vertical direction and is mounted in the supporting member 9 facing each other with a horizontal rotary axis being positioned in the center; a turntable 8 over which the cradles 2 are mounted through the supporting member 9 for the horizontal rotation; a drying chamber 5a which has a cover 4 over the cradles 2; and a balancing mechanism 3 which, in order to keep the balance of the rotation of the turntable 8, moves and adjusts, in the radial direction of the rotation, the supporting member 9 supporting the cradles.

In the embodiment of the invention shown in the drawings, there are two cradles 2, and the shielding plate 1 is constituted by two half circular plates. Each of the half circular plates is coupled to the lower part of each of the supporting member 9 and to the sliding portion of the balancing mechanism 3. Also, in order to ensure that the movement of the shielding plate members for balancing the rotation of the turntable 8 does not cause the balancing mechanism 3 to be exposed, the shielding plate members are partly overlapped with each other with the overlapped portion being located at a vicinity of the axis of the rotation. Around the peripheral edge portion of the shielding plate 1, there are provided a number of vanes 11 whose tip ends extend near to a bulged portion of the wall of the drying chamber 5a. A kind of fan is formed by the bulged portion of the drying chamber 5a and the vanes 11 with the bulged portion functioning as a casing of the fan.

The vacant section 5c in which the balancing mechanism 3 is disposed is surrounded by a partition plate 12. The partition plate 12 is arranged such that the air containing the water drawn from the drying chamber 5a by the pumping action generated by the vanes 11 of the shielding plates 1 is prevented from entering into the vacant section 5c, and also that their upper end portion is bent back to the extent that it does not interfere with the shielding plate 1.

The isolating chamber 5b is constituted by a chamber defined by an outer wall continued from the bulged portion of the drying chamber 5a, and a groove 14 is provided at a lower part of the outer wall. An inner wall of this groove 14 continues to a sloped portion 15 which leads to a portion where a seal 13 for the rotary axis 10 is provided. This groove 14 has a slight inclination and leads to the exhaust opening 7a.

Now, how the air containing particles and water is exhausted by the wafer drying apparatus according to the invention is explained. First, the water containing the particles scattered from the wafers 16 by the centrifugal force due to the rotation of the turntable 8 are scattered toward the inner wall of the drying chamber 5a. Then, as shown by the arrow in FIG. 2B, as the shielding plate 1 rotates together with the rotation of the turntable 8, the water scattered by the pumping action of the vanes 11 is drawn out from the isolating chamber 5b along with the air within the drying chamber. The air which contains the water and particles and which is introduced into the isolating chamber 5b reaches the groove 14, and the water and particles adhere to the wall of the groove 14 and are exhausted to the exhaust opening 7a by the flow of the air.

When the wafer drying apparatus according to the present invention was used, it has been found that the number of particles attached to the wafers 16 was 1/10 as compared with that in the conventional wafer drying apparatus. It has been confirmed that no water or particles entered in the balancing mechanism constituting a moving part, which ensures a long period operation of the apparatus.

In the apparatus according to the invention, since the shielding plate shields the balancing mechanism from being exposed and has a pumping function to draw out the air from the drying chamber, and also since the partition plate prevents the drawn air containing water and particles from entering into the balancing mechanism, there is no possibility for the particles to be attached again to the wafers, thus preventing the production yield deterioration. Further, since the water and particles do not enter into the moving part of the apparatus, no clinging or corrosion occurs at the moving part thereby ensuring a long period operation.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A wafer drying apparatus comprising:

a plurality of cradles each of which has a holding case for accommodating a plurality of wafers and which are allowed to swing vertically on a supporting member and which are disposed facing each other with the axis of horizontal rotation being positioned in the center;

a turntable over which said cradles are mounted through said supporting member and which rotates horizontally;

a drying chamber which surrounds said cradles;

a balancing mechanism which, for balancing the rotation of said turntable, adjusts said supporting member supporting said cradles by allowing said supporting member to move in a radial direction of the rotation of said turntable;

a shielding plate formed of half circular plates which are provided respectively to said supporting member, are partially overlapped near said axis of horizontal rotation, and are configured such that said balancing mechanism is covered thereby and that a peripheral portion thereof extends to a side wall of said drying chamber and is provided with a plurality of vanes; and an isolating chamber which is partitioned by said shielding plate and has a partition plate which defines a vacant section surrounding said balancing mechanism and an exhaust opening from which the air in said drying chamber is drawn out by a pumping action of said vanes due to the rotation of said shielding plate and is exhausted to the outside through an external wall of said partition plate.

2. The wafer drying apparatus according to claim 1, in which said isolating chamber is defined by a bulged wall and said vanes of the shielding plate extend their tip ends near to said bulged wall.

3. The wafer drying apparatus according to claim 1, in which an upper end portion of said partition plate is bent back.

* * * * *